(12) United States Patent
Martin et al.

(10) Patent No.: US 6,275,722 B1
(45) Date of Patent: Aug. 14, 2001

(54) METHODS AND APPARATUS FOR MAGNETIC RESONANCE IMAGING WITH RF COIL SWEEPING

(75) Inventors: Alastair Martin, St. Louis Park, MN (US); Joop Vaals Van, Best (NL)

(73) Assignee: Philips Electronics North America Corporation

( * ) Notice: Subject to any disclaimer, the term of this patent is extended or adjusted under 35 U.S.C. 154(b) by 0 days.

(21) Appl. No.: 09/363,348

(22) Filed: Jul. 29, 1999

(51) Int. Cl.$^7$ ................................................ A61B 5/05
(52) U.S. Cl. ................ 600/410; 600/422; 600/411; 600/414; 600/423; 324/308; 324/318; 324/322; 606/130
(58) Field of Search ........................... 600/407, 422, 600/410, 413, 309, 411, 414, 424; 606/130, 423; 324/318, 322, 307

(56) References Cited

U.S. PATENT DOCUMENTS

| | | | |
|---|---|---|---|
| 5,271,400 | 12/1993 | Dumoulin et al. | 128/653.2 |
| 5,318,025 | 6/1994 | Dumoulin et al. | 128/653.2 |
| 5,443,489 | * 8/1995 | Ben-Haim | 607/115 |
| 5,560,361 | * 10/1996 | Glusick | 128/653.2 |
| 5,644,234 | * 7/1997 | Rasche et al. | 324/318 |
| 5,715,822 | 2/1998 | Watkins et al. | 128/653.5 |
| 5,951,472 | * 9/1999 | Vaals et al. | 600/411 |
| 5,964,705 | * 10/1999 | Truwit et al. | 600/423 |
| 6,016,439 | * 1/2000 | Acker | 600/411 |

FOREIGN PATENT DOCUMENTS

0775923A2   5/1997   (EP) ................ G01V/3/14

OTHER PUBLICATIONS

"Real–Time Position Monitoring of Invasive Devices Using Magnetic Resonance" by C.L. Dumoulin, S.P. Souza, R.D. Darrow, in MR Device Tracking, pp. 411–415 (1993).
"Catheter Tracking Using Continuous Radial MRI" by Volker Rasche, Dietrich Holz, Jurgen Kohler, Roland Proks, Peter Roschmann, in Magnetic Resonance in Medicine M, 37, pp. 963–968 (1997).

(List continued on next page.)

Primary Examiner—Marvin M. Lateef
Assistant Examiner—Jeoyuh Lin
(74) Attorney, Agent, or Firm—John F. Vodopia

(57) ABSTRACT

This invention relates to a method for MR imaging using a moveable RF receiving coil assembly that is swept over the region of interest to be imaged during the imaging protocol. In particular, the method includes: exciting nuclear magnetization in the region of interest by applying radio-frequency (RF) pulses and magnetic field gradients according to a selected imaging protocol, receiving RF imaging signals generated in an RF receiving coil by the excited nuclear magnetization while sweeping the moveable RF receiving coil assembly near the region of interest, wherein the moveable RF receiving coil assembly includes the RF receiving coil and means for repetitively determining a 3D position and a 3D orientation of the RF receiving coil, determining repetitively 3D positions and 3D orientations of the RF receiving coil during the period of receiving of RF imaging signals, reconstructing an MR image of the region of interest from the received MR imaging signals and from the determined 3D positions and 3D orientations of the RF receiving coil. The position determining means preferably includes at least three MR-active microcoils. The invention also relates to a moveable RF receiving coil assembly and to a MR apparatus, both suitable for use in the method of the invention.

20 Claims, 5 Drawing Sheets

OTHER PUBLICATIONS

"MR Imaging of Blood Vessels with an Intravascular Coil" by Alastair J. Martin, Donald B. Plewes, R. Mark Henkelman, in JMRI, 2, p. 421–429 (1992).

"Intravascular (Catheter) NMR Receiver Probe: Preliminary Design Analysis and Application to Canine Iliofemoral Imaging" by Gregory C. Hurst, Jianmin, Jeffrey L. Durek and Alan M. Cohen, in Magnetic Resonance in Medicine 24, pp. 343–357 (1992).

"Integrated and Interactive Position Tracking and Imaging of Interventionall Tools and Internal Devices Using Small Fiducial Receiver Coils" by Glyn A. Coutts, David J, Gilderdale, Ming Chui, Larry Kasuboski, Nandita M. DeSouza, in Magnetic Resonance in Medicine 40, p. 908–913 (1998).

"Magnetic Resonance Imaging of the Uterine Cervix Using an Intravaginal Coil" by C.J. Baudouin, W.P. Soutter, D.J. Gilderdale and G.A. Coutts, Magnetic Resonance in Medicine 24, p. 196–203 (1992).

"Rapid 3d Tracing of Small RF Coils", Book of Abstracts, $5^{th}$ Annual Meeting of the SMRM 1986, p. 1131–1132.

Early Postoperative Magnetic Resonance Imaging after Resection of Malignant Glioma: Objective Evaluation of Residual Tumor and Its Influence on Regrowth and Prognosis, by Friederich K. Albert, Michael Forsting, Klaus Sartor, Hans–Peter Adams, Stefan Kunze, in Neurosurgery, vol. 34, No. 1, Jan. 1994.

"Inflatatble Surface Coil for MR Imaging of the Prostate" by Joel F. Martin, Paul Hajek, Lori Baker, Victorio Gylys–Morin, Renee Fitzmorris–Glass, Robert R. Mattrey, in Radioloy 167, p. 268–270 (1988).

"Retrospective Correction of Surface Coil MR Images Using an Automatic Segmentation and Modeling Approach" by Brian D. Ross, Peyton Bland, Michael Garwood and Charles R. Meyer, in NMR in Biomedicine, vol. 10, pp. 125–128 (1997).

* cited by examiner-

METHODS AND APPARATUS FOR MAGNETIC RESONANCE IMAGING WITH RF COIL SWEEPING

BACKGROUND OF THE INVENTION

1. Field of the Invention

The present invention relates to methods and apparatus for nuclear magnetic resonance (MR) imaging, in particular to MR methods and apparatus permitting reconstruction of MR images from signals received from an RF receiving coil which is swept over a region of interest during imaging.

2. Description of the Related Art

The clinical success of surgical tumor resection is often limited by residual tumor which remains at the completion of the procedure. This limitation is particularly common with brain tumors where access to the lesion is limited both by anatomic constraints (skull, etc.) and by the surgeon's desire to produce minimal morbidity. As a result, tumor may remain hidden from the surgeon and go undetected until post-operative imaging is performed.

Studies (see, e.g., Albert et al., 1994, Neurosurgery 34-1:45–60) have motivated the addition of intra-operative imaging modalities, including ultrasound, computed tomography (CT), and magnetic resonance (MR), in order to provide feedback to the surgeon on the status of the surgical procedure at a time when the surgeon can still react appropriately. In particular, such imaging can provide an assessment of the tissue along the border of the resection cavity that has been created by the surgical procedure and identify residual tumor.

Therefore, for this and other reasons, intra-cavity MR imaging is of particular interest. Intra-cavity RF coils for MR imaging have been proposed and developed for evaluation of the prostate (Martin et al., 1988, Inflatable surface coil for MR imaging of the prostate, Radiology 167:570–574), cervix (Baudouin at al., 1992, Magnetic resonance imaging of the uterine cervix using an intravaginal coil, Magnetic Resonance in Medicine 24:196–203), vascular wall (Hurst et al., 1992, Intravascular (catheter) NMR receiver probe: preliminary design analysis and application to canine iliofemoral imaging, Magnetic Resonance in Medicine 24:343–357; Martin et al., 1992, MR imaging of blood vessels with an intravascular coil, Journal of Magnetic Resonance Imaging 2:421–429), and esophagus. Such small internal coils offer substantial signal-to-noise (S/N) advantages over larger external coils, and thereby permit high resolution imaging of tissue in close proximity to the RF coil.

However, these intracavity coils are necessarily small, and, therefore, are necessarily limited because their region of sensitivity is thereby strictly localized. Tissue away from the RF coil is not efficiently detected with such intracavity coils. Unfortunately, an optimally large coil for intra-cavity imaging is unlikely to be available because the extent of the cavity is unique and may not be known a priori, and because access to the surgical cavity may be through an orifice of minimal diameter.

Citation of a reference herein, or throughout this specification, is not to be construed as an admission that such reference is prior art to the Applicant's invention of the invention subsequently claimed.

SUMMARY OF THE INVENTION

The objects of the present invention are to provide methods and apparatus which overcome the above identified problems in the current art, namely which provide for imaging other than a strictly localized region by use of intracavitary coils. In particular, according to one object of this invention, novel imaging methods are provided according to which an intracavitary coil is swept or moved around the periphery of a cavity during imaging in order to obtain high resolution images of a substantial region of the cavity boundary and adjacent tissue. According to another object of this invention, smaller RF coils are provided which may be introduced into surgical cavities and cooperate with these novel imaging methods. Finally, according to other objects, this invention provides MR apparatus for performing these methods and software for controlling an MR apparatus to perform these methods.

The methods and apparatus of this invention are routinely extendable to other imaging applications where movement of an RF coil during imaging is necessary or unavoidable. For example, they are extendable to imaging the exterior of a patient and adjacent tissues at high S/N ratio.

These objects are achieved by the following embodiments of this invention.

In a first embodiment, the invention includes a method for magnetic resonance (MR) imaging of a region of interest in an object to be examined by means of a moveable RF receiving coil assembly, the method comprising: exciting nuclear magnetization in the region of interest by applying radio-frequency (RF) pulses and magnetic field gradients according to a selected imaging protocol, sweeping the moveable RF receiving coil assembly near the region of interest, receiving RF imaging signals generated in an RF receiving coil by the excited nuclear magnetization, wherein the moveable RF receiving coil assembly comprises the RF receiving coil and means for repetitively determining a 3D position and a 3D orientation of the RF receiving coil, determining repetitively 3D positions and 3D orientations of the RF receiving coil during the period of receiving of RF imaging signals, reconstructing an MR image of the region of interest from the received MR imaging signals and from the determined 3D positions and 3D orientations of the RF receiving coil.

In a first aspect of the first embodiment, the means for repetitively determining a 3D position and a 3D orientation comprises at least three MR-active microcoils, and wherein the step of determining repetitively further comprises: exciting nuclear magnetization in the microcoils, receiving MR signals generated in the microcoils from the excited nuclear magnetization, determining the 3D spatial coordinates of the microcoils from the received MR signals, and determining the 3D position and the 3D orientation of the RF receiving coil from the 3D spatial coordinates of the microcoils.

In a second embodiment, the invention includes a moveable radio-frequency (RF) receiving coil assembly for receiving RF signals generated by nuclear magnetization excited by a magnetic resonance (MR) apparatus in a region of interest in an object to be examiner comprising: manipulation means for manipulating the moveable RF receiving coil assembly, an RF receiving coil for receiving RF imaging signals, at least three MR-active microcoils for receiving MR position signals from which the 3D spatial coordinates of the microcoils can be determined, wherein at least three of the microcoils are non-collinearly arranged, and signal lines for connecting the RF receiving coil and the microcoils to RF receivers in the MR apparatus.

In a third embodiment, the invention includes a magnetic resonance (MR) apparatus for MR imaging of a region of interest in an object to be examined comprising: a main field magnet for generating a steady magnetic field in the region of interest, a magnetic field gradient system for generating gradients in the steady magnetic field in the region of interest, a radio-frequency (RF) transmitter for transmitting RF pulses to the region of interest, an RF receiving coil assembly further comprising manipulation means for manipulating the RF receiving coil assembly, an RF receiving coil for receiving MR imaging signals from the region of interest, at least three MR-active microcoils for receiving MR position signals from which the 3D spatial coordinates of the microcoils can be determined, wherein at least three of the microcoils are non-collinearly arranged, and signal lines for connecting the RF receiving coil and the microcoils to the MR apparatus, means for detecting the received MR imaging signals and the received MR position signals, control means responsive to the detected MR imaging signals and the detected MR position signals for controlling the RF transmitter, the magnetic field gradient system, and the means for detecting to (i) excite nuclear magnetization in the region of interest by applying RF pulses and magnetic field gradients according to a selected imaging protocol and to detect MR imaging signals received in the RF receiving coil, (ii) determine repetitively 3D positions and 3D orientations of the RF receiving coil from the detected MR position signals which are repetitively generated during the period of receiving the MR imaging signals, and (iii) to reconstruct an MR image of the region of interest from the received MR imaging signals and from the determined 3D positions and 3D orientations of the RF receiving coil, wherein during the period of receiving the MR imaging signals the RF receiving coil is swept near the region of interest.

In a fourth embodiment, the invention includes a computer readable media encoded with program instructions for causing a programmable control means of an MR apparatus to perform the method of the first embodiment.

BRIEF DESCRIPTION OF THE DRAWING

Other objects, features and advantages of the present invention will become apparent upon perusal of the following detailed description when taken in conjunction with the appended drawing, wherein.

DETAILED DESCRIPTION OF THE INVENTION

Figure 1:
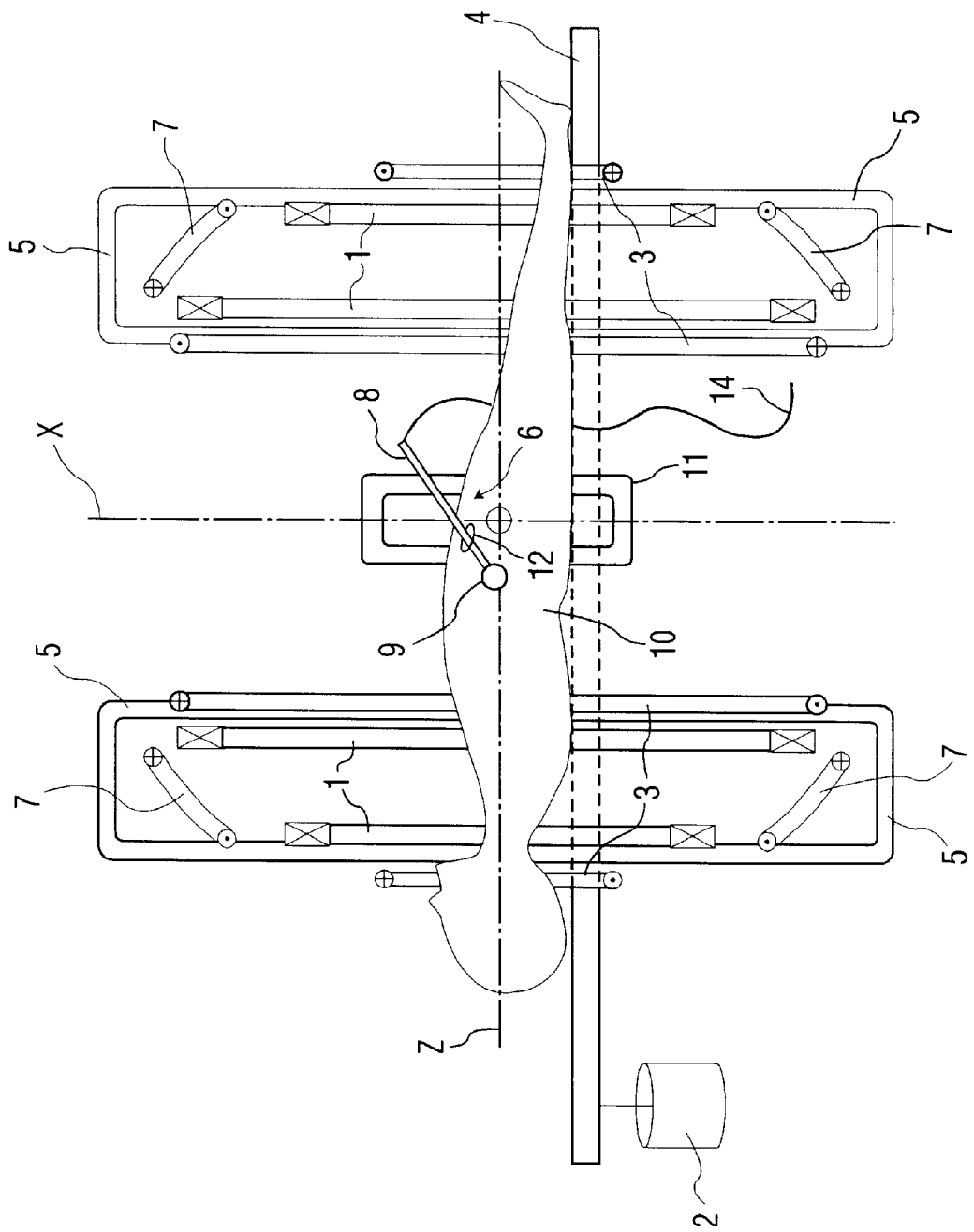
FIG. 1 illustrates an exemplary embodiment of an MR apparatus according the present invention.

In the following, various embodiments of the methods, moveable RF receiving coils, and MR apparatus of this invention are described with reference to the figures of the drawing. In certain figures, this invention is described as being adapted to a particular, but exemplary, MR system and a particular but exemplary imaging protocol. In view of the subsequent description, it will be readily apparent to one of skill in the art how to adapt and use the present invention with MR apparatus of the other physical and functional designs known in the art, and now to adapt and use the present invention with other imaging protocols known in the art.

Described sequentially in the following are (i) an exemplary MR apparatus, (ii) an exemplary moveable RF receiving coil, (iii) the method of this invention, and (iv) exemplary imaging protocols.

MR Apparatus for use in the Present Invention

Turning first to FIG. 1, illustrated therein, in partial cross-section, is the physical structure of an exemplary MR apparatus for use in the present invention. The illustrated MR apparatus includes a main-field magnet including a system of four coils 1 for generating a uniform, steady magnetic field within a homogeneity volume whose strength may be in the range of from some tenths of a Tesla (T) up to 2 T or more. These coils are situated concentrically with respect to the Z-axis. Within the homogeneity volume, the steady magnetic field is sufficiently homogeneous for satisfactory MR imaging.

The illustrated main field magnet is in a so-called "double-doughnut" configuration in order to provide operator access to the patient so that hand-held receiving coil assembly 6 of the present invention is easily moveable by the operator in or over at least a portion of patient 10. Such main-field magnets having such an "open" configuration are highly preferable.

The exemplary MR apparatus also includes a magnetic field gradient system for generating gradients of the Z-component of the magnetic field along the three coordinate axes. Four coils 3, concentrically situated with respect to the Z-axis, generate a magnetic gradient field extending along the Z-axis and varying linearly in this direction. Four coils 7 generate a magnetic gradient field also extending along the Z-axis but varying linearly along the X-axis (vertically). Finally, a magnetic gradient field also extending along the Z-axis but varying linearly along the Y-axis (perpendicular to the plane of FIG. 1) is generated by four coils 5 (only two of which are illustrated), which may be identical to the coils 7 but arranged to be offset 90° in space with respect thereto. Preferably, the fields generated by coils 3, 5, and 7 vanish at the coordinate origin so that the field strength there is determined exclusively by the steady uniform magnetic field of main field coil system 1.

The exemplary MR apparatus further includes stationary RF coil systems for transmitting RF pulses to an object to be examined in order to excite nuclear magnetization therein, and for receiving RF signals form the excited nuclear magnetization. Either a single coil system can be used for receiving and for transmitting, as illustrated by coil 11 in FIG. 1, or separate stationary transmitting coils and receiving coils can be provided.

FIG. 1 also illustrates an object to be examined, for example patient 10, positioned within the coils of the main-field and gradient-system magnets. Patient 10 is arranged on table top 4, which can be displaced longitudinally through the MR apparatus in order to position a region of interest in the patient within the homogeneity volume of the main-field magnet.

According to the present invention, the object to be examined, for example patient 10, is examined at high resolution with high a signal-to-noise (S/N) ratio by means of the hand-held moveable RF receiving coil assembly of this invention, an embodiment of which is illustrated as moveable RF coil assembly 6. This coil is generally held and manipulated by an operator (not illustrated), such as a medical staff person, so that it is brought adjacent to or in proximity of the regions of most interest in or on patient 10 to receive MR signals of high S/N ratio from all of the region of interest. Thereby, an image of this region can be reconstructed at highest resolution.

The moveable RF coil assembly of the present invention, although described in greater detail subsequently, is generally illustrated in FIG. 1, to include at least a manipulation means, such as handle 8 adapted for convenient manipulation, an RF receiving coil contained in a coil holder, such as coil holder 9 sized and shaped for the region to be examined, and a cable, such as cable 14, adapted to conduct signals between the coil assembly and the MR apparatus through the MR environment (which has high and time-variable magnetic fields).

In a typical application, the moveable RF coil assembly is used to generate detailed images of the periphery and adjacent tissues of a cavity or lumen, either naturally present or surgically created, in a patient. Accordingly, in FIG. 1 moveable RF coil assembly 6 as illustrated is introduced into the abdomen of patient 10 through surgical incision 12. Preferably, the coil assembly is structured for introduction into a cavity through the smallest possible incision in order that the trauma of surgery can be minimized. While in the cavity, coil holder 9 is swept around its periphery in order to receive MR imaging signals of high S/N ratio from all adjacent tissues.

In order to reconstruct images, the methods of this invention require knowledge of the instantaneous three-dimensional (3D) positions and orientations of the moveable RF coil assembly during MR image data collection. A 3D position can be defined by three spatial coordinates of the RF coil assembly (or of a known point on the coil assembly) with respect to the fixed MR coordinate system; the orientation can be defined by three 3, 5, and 7.

Nuclear magnetization in the examination zone is excited by RF pulses from an RF transmitter system, which includes: RF transmitter coil 11, RF amplifier 26, RF transmitter 27, waveform generator 28, and RF oscillator 29. In operation, control unit 21 loads data describing a pre-determined time-dependent RF waveform envelope into waveform generator 28. On command, the RF transmitter then combines the pre-determined waveform envelope with the output of RF oscillator 29, which is a carrier with a frequency corresponding to the $^1$H Larmor frequency (approximately 63 MHZ in the case of a main field of 1.5 T), to generate an RF signal. This RF signal is amplified by RF amplifier 26 in order to drive RF transmitter coil 11 to radiate pulses for exciting the nuclear magnetization.

MR signals generated from an object in the examination zone are picked up by RF receiving coils and processed by the RF receiver system, including RF amplifiers 30, quadrature demodulator 31 and analog-to-digital (A/D) converter 32. Among the RF receiver coils is the moveable RF coil of this invention, mounted in coil holder 9. Also, RF receiving coils include, optionally, conventional stationary RF receiving coils known in the art, such as coil 37. Also, optionally, RF transmitted coil 11 can also be used as a receiver coil, in which case a transmit/receive switch (not illustrated) is provided to switch between the output RF amplifier when transmitting and the input RF amplifier when receiving. Quadrature demodulator 31 demodulates the received, amplified MR signals with reference to two 90° offset carrier oscillations at the Larmor frequency supplied by RF oscillator 29, and generates two signals which can be considered as the real and the imaginary parts of a complex MR signal. On command by control unit 21, the demodulated signals are applied to A/D converter 32, which forms digital MR data therefrom. The digital MR data are stored in a reconstruction unit 22 which reconstructs, in cooperation with workstation 20, MR images representing the nuclear magnetization excited in an object being examined.

According to the present invention, the MR apparatus also includes a position detection system capable of determining the position and orientation of the moveable RF coil assembly, and especially of the moveable RF coil holder 9, either when positioned in a angles, for example the well-known Euler angles, defining its angular orientation (two angles suffice if the RF coil is circularly symmetric) with respect to the fixed coordinate system.

To measure 3D positions and orientations, the moveable RF coil assembly is structured to cooperate with any position detection system to generate signals representative of the current instantaneous position and orientation of the RF receiving coil, the signals being processed to obtain the needed measurements. The present invention is adaptable to any position detection system that can function in the MR environment to generate such signals equally well both inside a patient or on the surface of the patient. An MR apparatus for use with the present invention then includes whatever additional elements are necessary for the selected position detection system.

A preferred position detection system, described in detail subsequently, includes at least three microcoils, each containing an MR active medium which can be excited to generate MR signals. The microcoils are arranged in a non-collinear manner in coil holder 9. From the microcoil signals the three spatial coordinates of each microcoil can be determined. Then, by routine methods, from the three spatial coordinates of each non-collinear microcoil, the position and orientation of RF receiving coil holder 9 of coil assembly 6 can be also routinely determined.

Figure 2:
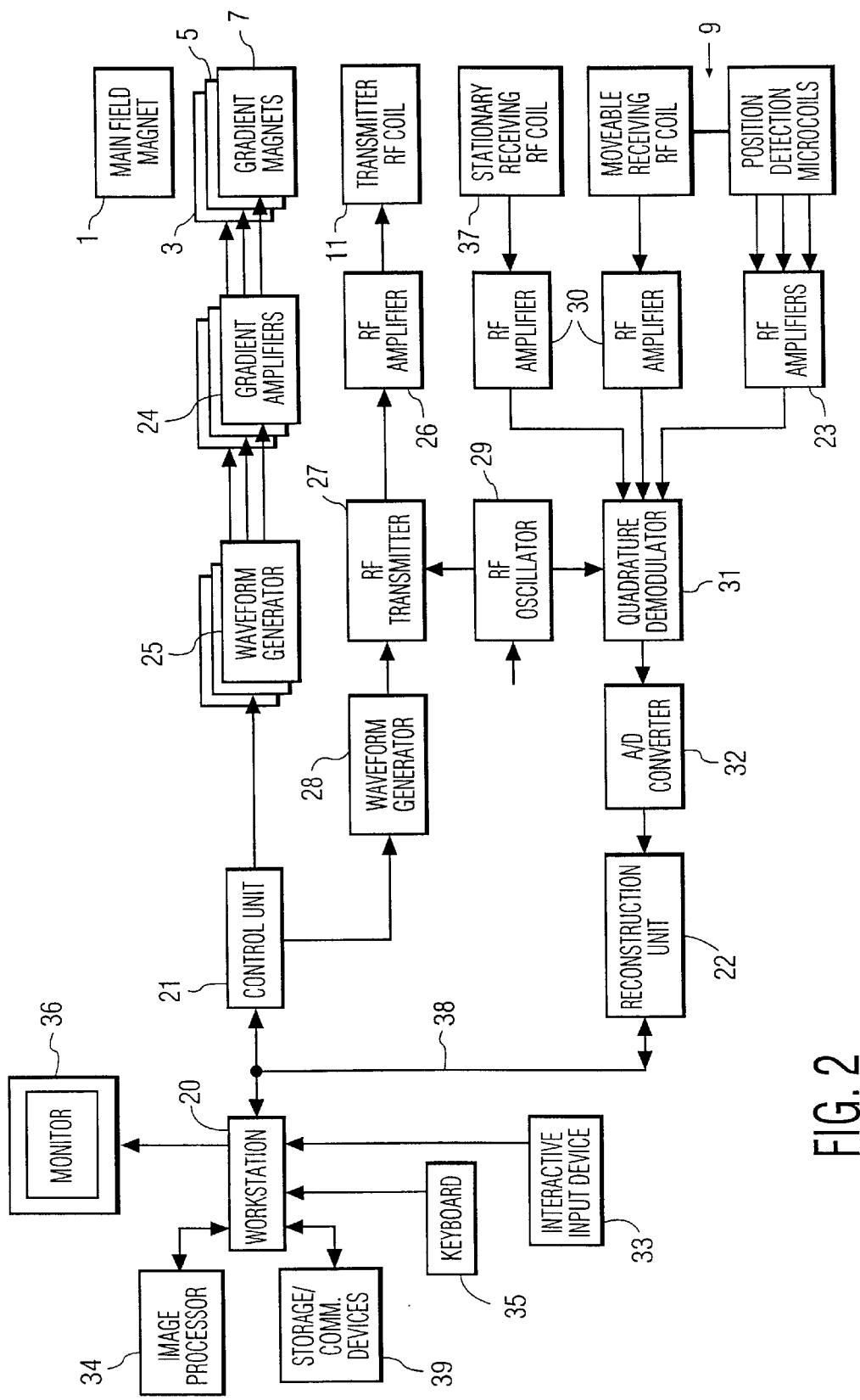
FIG. 2 illustrates a functional block diagram of the exemplary embodiment of FIG. 1.

Turning next to FIG. 2, illustrated therein is an exemplary functional block diagram of the control and processing units of the MR apparatus illustrated in FIG. 1. Main field magnet 1 can be separately controlled and aligned to generate a steady magnetic field along the Z-axis of a strength, for example, of from 0.5 to 1.5 Tesla, and sufficiently homogenous in a homogeneity volume centered on the coordinate origin in FIG. 1.

The magnetic field gradient system includes: magnet coils 7, 5, and 3 capable of generating magnetic gradient fields $G_x$, $G_y$, and $G_z$ which extend along the Z-direction and have gradients along the X-, the Y-, or the Z-axes, respectively, three gradient amplifiers 24, and three waveform generators 25. In operation, control unit 21 loads data describing pre-determined envelopes for the time-behaviors of the three gradient fields into waveform generators 25, which on command generate the pre-determined waveforms. These waveforms are amplified by gradient amplifiers 24 in order to drive gradient magnet coils cavity in the patient or on the surface of the patient. FIG. 2 illustrates an embodiment of the preferred position detection system, which determines the 3D position and orientation of RF coil assembly 9 from MR signals generated by three microcoils 9 non-collinearly mounted in the RF coil assembly. FIG. 2 illustrates the RF coil holder 9 as mounting both the moveable RF receiving coil and the position detection microcoils.

Determination of the position of an MR-active microcoil from received MR signals is known from, e.g., U.S. Pat. Nos. 5,271,400 and 5,318,025. Three spatial coordinates of such a microcoil can be determined from the central frequency of the Fourier transformation of the MR signals which are received from the microcoils and which are generated in the presence of linear gradients along the X-, Y-, and Z-axes in the main magnetic field after excitation of nuclear magnetization in the active material enclosed in the microcoils. In the presence of linear gradients, the spatial coordinates of the microcoil is proportional to the central frequency received by the microcoil. In detail, excitation of the nuclear magnetization inside the microcoil can be non-selective or slab selective, or even slice selective, RF pulses, depending on an increasing certainty with which the expected position of the microcoil is known. The linear gradients can be applied separately or can be jointly applied according to a, for example, Hadamard encoding. See, e.g., Dumoulin, 1993, Magnetic Resonance in Medicine 29:411–415. Finally, three spatial coordinates defining the 3D position and three angles defining 3D orientation of the moveable RF receiver coil can then be determined in a known geometric manner from the three spatial coordinates of the three non-collinearly arranged microcoils.

In the illustrated embodiment, signals from three microcoils mounted in RF coil holder 9 are separately amplified by three-channel RF amplifier 23, and are processed and Fourier transformed by the elements shared with the image reconstruction process. Alternately, a separate quadrature demodulator, A/D converter, and Fourier transform unit can be provided for this task.

Finally, an MR apparatus according useable for the present invention also includes control means for controlling the functional components described to generate and receive MR image data from an object to be examined, to process the received data, to reconstruct MR images from the processed data, and to perform necessary associated computation according to the methods of this invention. In the exemplary embodiment illustrated in FIG. 1 the control means includes workstation 20 in cooperation with control unit 21 and reconstruction unit 22.

Workstation 20 includes keyboard 35 and interactive input unit 33, for example a light pen or a "mouse", for entry of operator commands and queries. Device 39, which represents fixed and removable storage devices as well as optional communication links, stores data and programs and exchanges the same with other computer systems. Reconstructed images can be displayed on monitor 36, perhaps after image enhancement or other image processing by optional image processor 34. As described subsequently, images can also be displayed to medical personal in real-time in the vicinity of the hand held moveable coil assembly, preferably on an LCD display near the patient.

Although the control means illustrated here is implemented by the separate and partially specialized elements 20–22, it will be apparent to one of skill in the arts that these control means can be routinely implemented in other functionally equivalent manners. For example, all control and processing functions can be implemented by a single sufficiently powerful workstation and attached interface hardware. Such a workstation, in response to memory-resident program instructions, can control the remaining functional elements according to the methods of this invention through the interface hardware, can reconstruct resulting MR images, can display the reconstructed, and so forth. This invention is to be understood to include such routinely-known alternative distributions of control and processing function.

Because implementations of such a control means commonly include programmable elements, the methods of this invention can be implemented as a program or programs having instructions, which, when resident in the memories of the programmable elements, command the performance of the present invention.

Accordingly, this invention further includes these program instructions and also carrier media on which these program instructions are impressed. Such carrier media include (removable) magnetic or optical media known in the art which can be read by storage device 39, as well as transmission over attached communication links.

The Moveable RF Coil Assembly of the Present Invention

Figure 3:
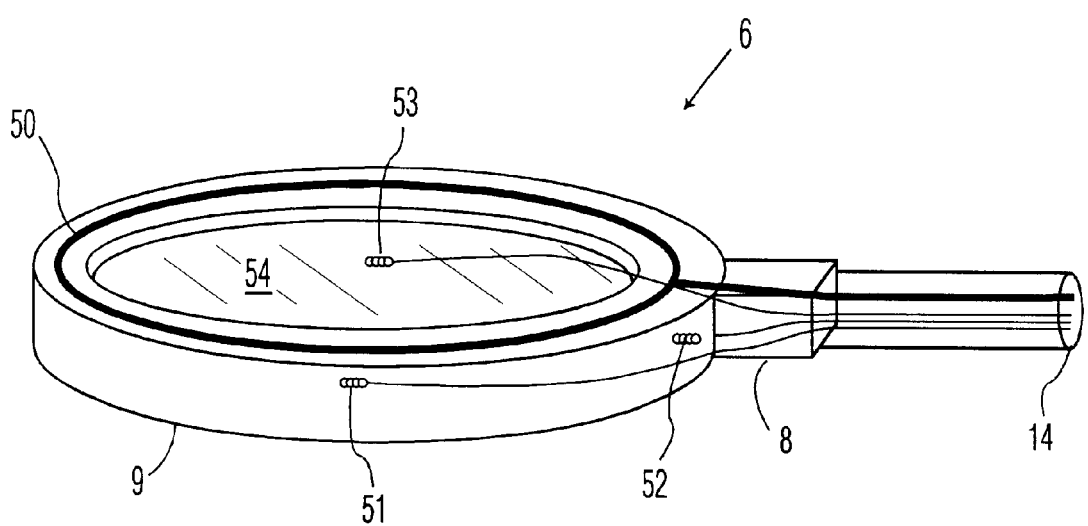
FIG. 3 illustrates an exemplary embodiment of a moveable RF coil according to eh present invention.

FIG. 3 illustrates an exemplary embodiment of a moveable RF coil assembly of this invention, which generally includes at least an RF receiving coil, at least 3 integrated positional microcoils, manipulation means such as a handle, and electronic components necessary to transfer received signals to processing devices.

In detail, RF receiving coil 50 and microcoils 51–53 are mounted in receiving coil holder 9. This invention includes receiving coil holders and mounted receiving coils of a wide variety of shapes and constructions determined by their intended uses. As illustrated, exemplary receiving coil holder 9 is of a generally circular and planar shape with membrane 54 across the circular opening. A receiving coil holder of such a shape is adapted to image tissues adjacent to the periphery of a generally globular cavity. The membrane across the opening prevents the coil holder from becoming entangled or hooked onto protuberances or other instruments possibly present in the cavity. Optionally, the coil holder can have, instead of a planar shape, a spherical shape so that it can be fit snugly against and swept along the periphery of the cavity. Advantageously, the coil holder can be made of a flexible, rubber-like material so that is can be compressed for introduction into a cavity through a narrow opening.

The shape of the coil holder can be adapted to cavities of other than globular shapes. For example, where the cavity of interest has a longer length than width, the receiving coil holder can instead be of an oblong shape. Where a tubular organ or cavity, such as a portion of intestine or blood vessel, is to be imaged, the receiving coil holder can be substantially tubular with an appropriate diameter.

The material of the coil holder can be adapted to the method of introduction and manipulation. It can be more or less flexible depending on the size of the cavity orifice compared to the size of the RF receiving coil and the degree to which turns and recesses in the cavity must be explored. A preferred but non-rigid shape can be achieved by including spring-like metal members in a rubber-like coil holder. As this invention is not limited to use in cavities, for imaging external to a patient, the receiving coil holder can also be preferably substantially rigid.

As illustrated, RF receiving coil 50 is mounted in a thickened circumference of the receiving coil holder. Alternately, the entire receiving coil holder can be equally thick or have other advantageous cross-sections. The RF receiving coil is designed generally according to known principles to achieve a superior S/N ratio. Generally, the RF coil is customized to the target space to produce a substantial RF magnetic field perpendicular to $B_0$. The shape of the receiving coil is limited by the allowed shape of the coil holder, but otherwise should have a diameter chosen to receive signals from the region to be imaged with the best possible S/N ratio. For example, the diameter should not be substantially less than the greatest depth of tissue to be imaged. The coil inductance and any associated tuning and matching capacitors are also chosen, as is also known in the art, to result in the best possible S/N ratio.

The coil holder also has mounted at least 3 MR-active microcoils for providing MR signals for 3D position and 3D orientation measurements. According to this invention, the 3D position and orientation of the RF receiving coil is determined throughout the image data acquisition. To permit such determinations, the microcoils are positioned in a non-collinear manner, and, advantageously for robust determinations, are positioned so that all of their mutual spacings are as great as possible. In the illustrated exemplary embodiment, microcoils 51 and 52 are positioned in the thickened circumference of coil holder 9, while microcoil 53 is positioned in membrane 54 at the center of the coil holder. Together these microcoils form a substantially right triangle. Alternately, more than three microcoils can be mounted in the receiving coil holder to provide redundant data for more accurate position and orientation measurements.

Preferably, the microcoils have separate tuning and matching capacitors as well as separate electrical leads connecting them to signal processing elements in the MR apparatus. Thereby, the spatial coordinates of all three microcoils can be simultaneously determined. Finally, in order to improve the MR activity of the microcoils, the MR-active medium in their interior includes a sample of a short-TR liquid species, such an aqueous medium doped with a gadolinium salt.

The moveable receiving coil is also provided with manipulation means according to its intended use. Illustrated in FIG. 3 is base portion 8 of a handle or a coupling means. For external use, the manipulation means may simply be a rigid handle sized and configured for manual manipulation. In this case, base portion 8 is the base of such a handle. For internal or intra-cavitary use, the manipulation means preferably cooperates with whatever instrumentation accompanies the intended surgical or imaging procedure. For example, base portion 8 may be adapted for attaching to or being gripped by surgical manipulation devices known in the art. Alternatively, base portion 8 may be adapted to cooperate with a catheter so that the RF coil holder may be introduced, positioned, and removed though the catheter. This invention comprehends RF coil holders structured to cooperate with other manipulation means known to one of skill to be convenient in a particular procedure.

Base portion 8 also, preferably includes such passive or active components as are routinely necessary both to tune and match signals for transfer over signal cable 14 between the coil assembly present in the MR imaging environment and the rest of the MR apparatus, and also to prevent RF transmissions from interfering with the RF amplifiers for microcoil signals. Signal cable 14 attaches near or at base portion 8 and preferably includes electrical leads for the RF receiving coil and for each microcoil.

The Methods of the Present Invention

Having thus described above the moveable RF coil assembly of the present invention and an exemplary MR apparatus with which it can be used, next, with reference to FIG. 4, the methods of this invention for use of the moveable coil and MR apparatus are set forth below. Generally, according to the methods of the present invention, while MR image data is generated according to a selected imaging protocol and received by the moveable RF coil of this invention, this coil is moved about, or scanned, over the target region, for example, a surgical cavity interior to a patient or an area exterior to the patient, in order to receive MR signals with superior S/N from all the tissues immediately adjacent to the region of interest. Since knowledge of the instantaneous 3D position and orientation of the RF receiving coil is needed for image reconstruction, interspersed with the excitation and measurement of MR imaging signals are RF pulses and gradient fields that are applied to generate microcoil signals from which the 3D position and orientation of the moveable RF receiving coil are determined.

From the received imaging signals, an MR image is reconstructed while taking into account the instantaneous positions and orientations of the moveable RF receiving coil that were determined during image data reception. Preferably, reconstructed MR images are displayed to the operator as soon as possible. NR images can be reconstructed from MR data which completely samples the FOV in the region to be imaged according to the selected imaging protocol. Advantageously, images are reconstructed and displayed in real-time from currently available image data, even though incomplete in that it does not completely sample the region to be imaged. Such real-time guidance permits the operator to carefully scan the coil near those tissue regions of greatest interest, and which, therefore, deserve the best resolution and least noise in a final MR image.

In the selected imaging protocol, to assure images with suitable contrast, it is preferable that central regions of k-space be repetitively measured, or oversampled, while the RF coil is in proximity with the tissues over which it is scanned, regardless of when during the imaging protocol the coil scans near a particular tissue. Preferable protocols, therefore, include either spiral or radial k-space protocols that necessarily continuously sample low and high spatial frequency signals. For protocols using conventional rectilinear k-space scanning, it is preferable to jump between acquiring low and high spatial frequency k-space lines, instead of simply linearly scanning k-space. Alternatively, the center of k-space can be periodically oversampled, or additional oversampling of the center of k-space can be triggered upon detecting significant motion of the RF receiving coil.

Here, the center of k-space is taken to mean that portion of k-space responsible for providing most image contrast, for example, the central 25–75% of the volume of k-space. Oversampling is taken to mean generating more MR signals from the center of k-space than are needed for complete sampling of the region to be imaged. In the case of rectilinear scanning, for example, the central lines of k-space can be sampled 2, 4 or more times.

Figure 4:
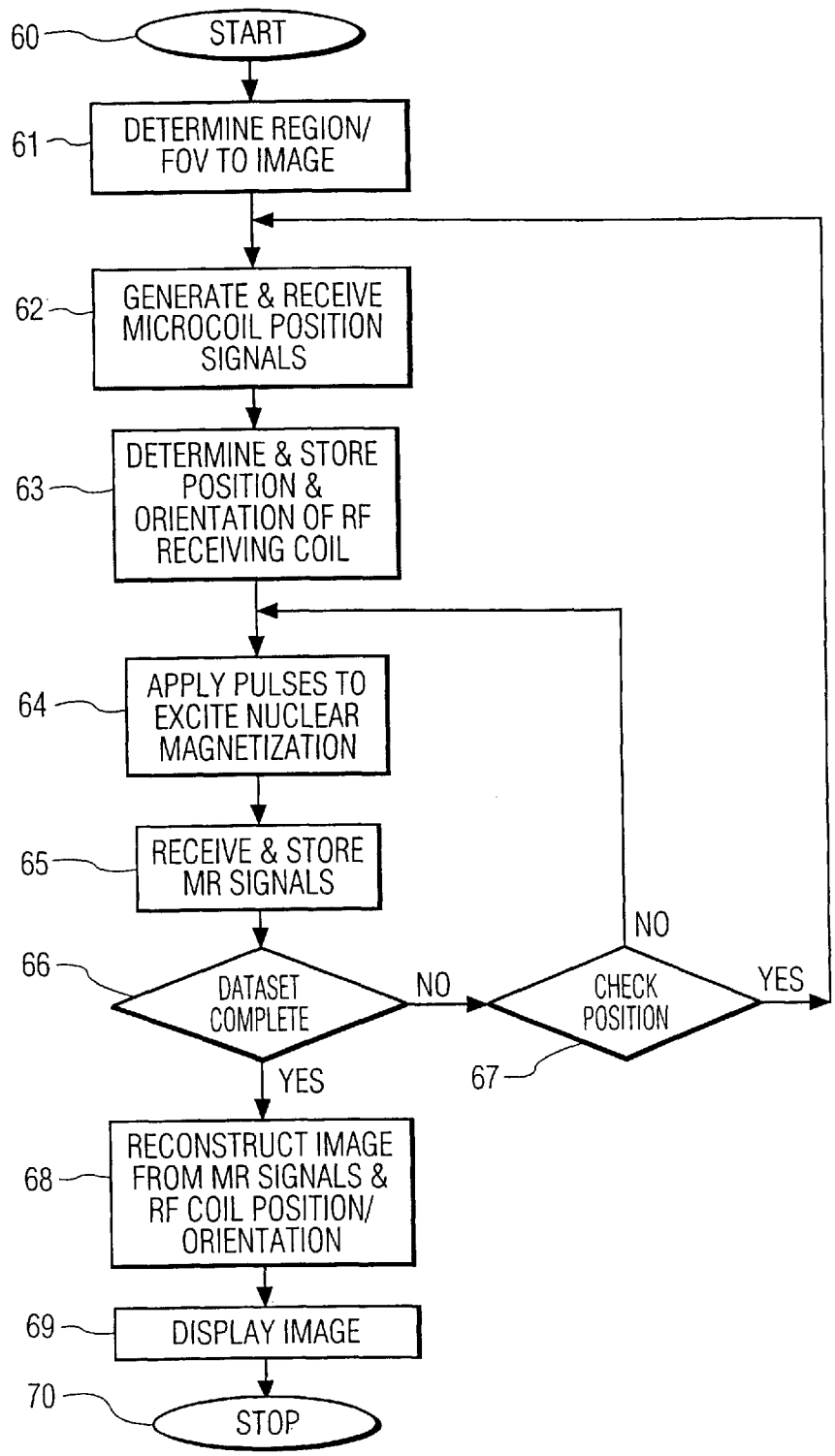
FIG. 4 illustrates a method according to the present invention.

In detail, turning now to FIG. 4, the methods of the present invention start at step 60, perhaps after receipt of an operator start command. At step 61, first, the region to be imaged and the imaged field-of-view (FOV) in that region are determined. In one alternative, the position and orientation of the imaged region can simply be specified with respect to the patient, and the patient appropriately positioned in the MR apparatus. In another alternative, the moveable RF coil can be positioned centrally in the region to be imaged; the 3D position and orientation of the RF coil is measured by generating signals in the position determining microcoils; and the position and orientation of the region to be imaged is determined with respect to the measured coil position and orientation. However determined, the region to be imaged and the FOV are then used in the MR apparatus to set the RF pulse and gradient parameters governing the subsequently performed imaging protocol. The methods of this invention can be used with regions to be imaged that are either a single two-dimensional (2D) slice, or are multiple 2D slices, or are true 3D regions.

At step 62, signals are generated in the microcoils, as previously described, by applying an RF pulse to excite nuclear magnetization interior to the microcoils and by inducing an echo in the presence of linear gradient fields. At step 63, from the microcoil signals the three spatial coordinates of each microcoil are determined, and from these coordinates, the instantaneous 3D position and 3D orientation of the moveable RF coil are determined. The determined instantaneous position and orientation are then stored for later use during image reconstruction.

Figure 5A:
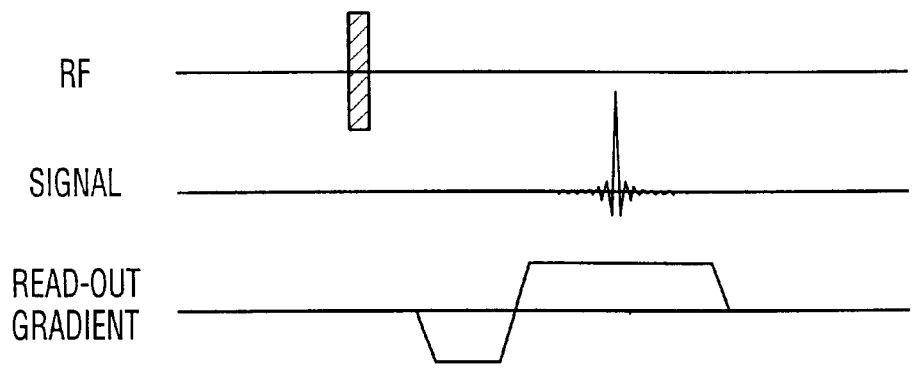
FIGS. 5A–B illustrate exemplary protocols for generating imaging signals.

An exemplary position signal generation protocol is illustrated in FIG. 5A. Here, illustrated on line 1, a non-selective RF pulse is applied to excite nuclear magnetization throughout a region including the microcoils. Illustrated on line 3 is a read-out gradient applied in order to generate an spin echo. This gradient varies along the X-, Y-, or Z-direction in order to obtain x, y, or z coordinates of the microcoil, respectively. Line 2 illustrates a echo signal received from one of the microcoils. The respective coordinate of the microcoil is determined from its central frequency.

Next, at step 64, RF pulses and gradient fields are determined according to the selected imaging protocol, and are applied in order to generate MR imaging signals from the region to be imaged. At step 65, the generated signals are received by the moveable RF coil and stored for subsequent image reconstruction. Preferably the signals are generated so that the, as previously described, the central regions of k-space are oversampled. Such oversampling can be a feature of the imaging protocol, can result from periodic generation of signals from central k-space, or can be triggered by detected significant changes in position of the RF receiving coil.

Figure 5B:
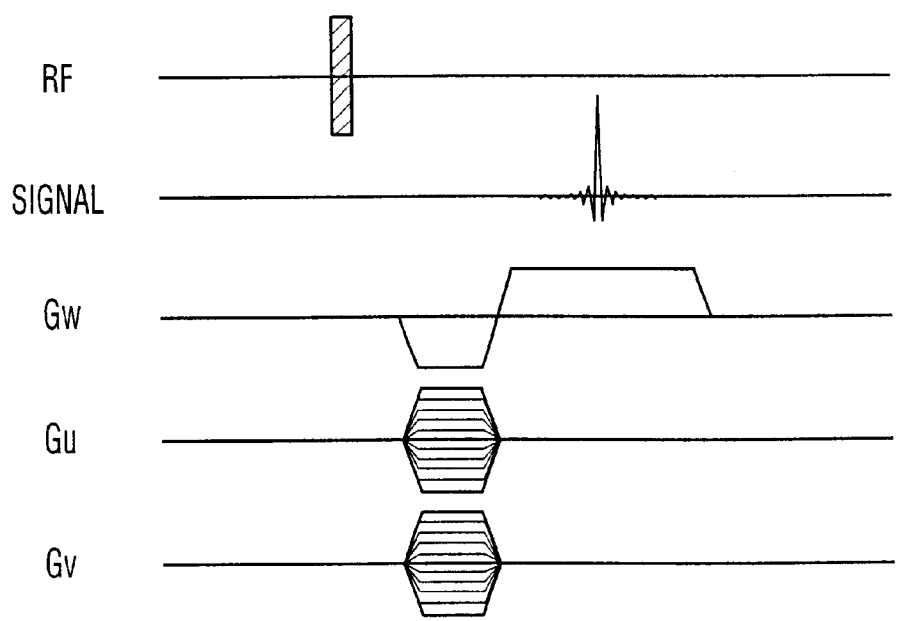

The wide variety of imaging protocols known in the art can be used in the methods of this invention. An exemplary FLASH (fast low-angle shot) imaging protocol is illustrated in FIG. 5B. Here, illustrated on line 1, a non-selective RF pulse is applied to excite nuclear magnetization throughout the region to be imaged, preferably at a tip angle of less than 90°, for example at a tip angle of 10° to 30°. Illustrated on lines 4 and 5 are phase encoding gradients $G_u$ and $G_v$ applied to phase encode the spin-echo signal along the orthogonal U and V directions. Illustrated on line 3 is a read-out gradient $G_w$ applied along the W direction, which is orthogonal to the U-V plane, in order to generate the spin echo. Line 2 illustrates the spin-echo signal received by the RF receiving coil. Optionally, after reception of the spin-echo signal, rephasing gradients can be applied along the U and V directions to reverse the dephasing caused by the phase-encoding gradients.

Since the U-V-W coordinate system is oriented consistently with the imaged volume, it will generally be oblique with respect to the X-Y-Z coordinate system, which is conventionally fixed in the MR apparatus. Generation of the $G_u$, $G_v$, and $G_w$, gradient fields is then routinely achieved by jointly applying a linear combination of the gradient fields $G_X$, $G_Y$, and $G_Z$ determined by the linear transformation between the X-Y-Z coordinate system and the U-V-W coordinate system.

Next, at step 66, it is checked whether a complete dataset for an entire image of the region to be imaged has been stored. If so, the method proceeds to image reconstruction and display. If not, the method proceeds to step 67, where it is checked whether the instantaneous position and orientation of the RF receiving coil needs to be determined again. Simply, this position and orientation can be periodically measured, for example every 0.3 to 1.0 secs. Alternatively, this position and orientation can be adaptively measured so that, depending on the recent history of RF receiving coil movement, measurements can be made sufficiently often. Position and orientation measurements in the latter alternative can be made when the position or orientation is expected to change based on extrapolating past measurements.

Finally, at step 68, an MR image of the region of interest is reconstructed from the stored MR image data and the stored instantaneous positions of the RF receiving coil according to methods described subsequently. The image is displayed at step 69, and the method terminates at step 70.

Alternatively, images can be reconstructed in real-time from partial image data and immediately displayed. Such real-time image can provide guidance so that the RF receiving coil can be swept over areas of the region needing an improved S/N.

In a further alternative, in order to facilitate image reconstruction, an approximate image of the FOV in the region to be imaged can be reconstructed from MR signals received by a standard body coil in the MR apparatus. Such an approximate image can be generated as part of, or immediately after, step 61.

This invention is understood to include further options are alternatives to the described methods that will be apparent to one of skill in the arts.

Image Reconstruction

Image reconstruction is described herein with respect to MR signals generated by 3D Fourier transform imaging protocols, such as are generated by the exemplary FLASH protocol illustrated in FIG. 5B. One of skill in the art, in view of the subsequent description, will immediately appreciate how to apply the described reconstruction methods to MR signals generated by other imaging protocols.

Typically, MR image signals, which are measured by a stationary RF receiver coil and which are generated by 3D Fourier transform imaging protocols, are described the $$S_{measured}(t) = \int_x \int_y \int_z m(x,y,z) \cdot e^{-2\pi i(k_x x + k_y y + k_z z)} dx dy dz$$

following signal equation.

In this equation $S_{measured}(t)$ is the temporal MR signal measured by a stationary RF receiving coil; $m(x,y,z)$ is the strength of the excited nuclear magnetism at the position $(x,y,z)$, and is generally a function of the proton density, the relaxation times $T_1$ and $T_2$, the exact protocol sequence, and so forth; and $(k_x, k_y, k_z)$ is a point in k-space. The reconstructed image, which is a display of $m(x,y,z)$, is simply obtained by an inverse Fourier transform of the measured MR signals.

The equation above assumes a uniform and temporally constant coil sensitivity. If the coil sensitivity is not uniform, but rather varies as $W(x,y,z)$, then the MR image signals $$S_{measured}(t) = \int_x \int_y \int_z m(x,y,z) \cdot e^{-2\pi i(k_x x + k_y y + k_z z)} dx dy dz$$

are described by the next signal equation.

Clearly, knowledge of $W(x,y,z)$ permits determination of the image, $m(x,y,z)$, from the inverse Fourier transform of the measured MR signals by any of several methods known to those of skill in the art. See, e.g., Ross et al., 1997, Retrospective correction of surface coil MR images using an automatic segmentation and modeling approach, NMR Biomedicine 10(3):125–128). In turn, $W(x,y,z)$ can be determined from the 3D position and 3D orientation of the RF receiving coil and from the spatial sensitivity of the receiving coil. The spatial sensitivity of an RF receiving coil, as is well-known, can be either theoretically determined or experimentally measured using a phantom in an MR apparatus.

However, when the RF receiving coil has not only a non-uniform sensitivity but also a temporally varying sensitivity, then blurring or ghosting artifacts ordinarily result in normally reconstructed images, due to the signal strength obtained from specific spatial locations being temporally modulated by their proximity to the RF coil. This situation is $$S_{measured}(t) = \int_x \int_y \int_z m(x,y,z,t) \cdot e^{-2\pi i(k_x x + k_y y + k_z z)} dx dy dz$$

described by the next signal equation.

where W(x,y,z,t) is now the spatially non-uniform and temporally varying coil-sensitivity weighting function. However, again, complete knowledge of W(x,y,z,t) is clearly sufficient for reconstruction of the image, m(x,y,z), from the measured MR signals, $S_{measured}(t)$. In other words, knowledge of the spatial and temporal variations of the moveable RF receiving coil sensitivity pattern provides the information necessary to decouple the true MR image from the anomalies arising from solely from the non-constant coil sensitivity.

According to the methods of the present invention, complete knowledge of W(x,y,z,t) is obtained from knowledge of the spatial pattern of the coil's sensitivity, that is W(x,y,z), and measurements of the instantaneous 3D position and 3D orientation of the RF receiving coil made while performing the imaging protocol. Knowledge of the spatial pattern of the coil's sensitivity can be determined, preferably, from theoretical modeling of the magnetic field generated by the coil together with the well-known reciprocity principle. Alternately, W(x,y,z) can be determined from measurements of the actual response of the coil made with phantom objects in an MR apparatus. As described, measurements of the instantaneous 3D positions and 3D orientations of the RF receiving coil are made and stored during the imaging protocol sufficiently often to adequately describe the time behavior of the RF receiving coil during imaging. With reference to FIG. 4, these measurements are made at steps 62, 63, and 67.

There is, therefore, a relationship between the measured MR signal and an image that is determinable provided the complete temporal and spatial response of the RF coil, W(x,y,z,t), is known. The methods of this invention make W(x,y,z,t) known. In detail, this relationship can be determined if W(x,y,z,t) is substantially periodic by direct use of the inverse Fourier transform after a separation of variables which permits temporal terms to be grouped in the exponential factor. W(x,y,z,t) is considered to be substantially periodic if it can be expressed as a Fourier series with one or at most a small number of terms. However, in general, W(x,y,z,t) is not substantially periodic, and the direct use of the inverse Fourier transform to convert the measured signal to the reconstructed image m(x,y,z) is not possible.

In the general case, because read-out periods are typically short, for example in the tens of msec., W(x,y,z,t) can be considered as fixed during read-out periods. However, since the interval between phase encode lines can be from several milliseconds to several seconds, W(x,y,z,t) is likely to change from phase encode line to phase encode line. Therefore, the inverse Fourier transform can be directly applied only along the read-out direction, taken here as along the x-direction, since W is known and essentially temporally constant during this period. But W must be considered to depend on the phase encode gradient values. In general, the resulting signal is therefore given by the following $$S_{measured}(t)=\int_x\int_y\int_z m(x,y,z) \cdot W(x,y,z,k_y,k_z)e^{-2\pi i(k_x x+k_y y+k_z z)}dxdydz$$

equation.

Here, $W(x,y,z,k_y,k_z)$ is the value of W(x,y,z,t) at that time when the k-space line defined by $k_y$ and $k_z$ is being read-out along the x-direction.

$W(x,y,z,k_x,k_y)$ can be immediately determined from the measured W(x,y,z,t), which in turn is determined from the stored instantaneous 3D positions and 3D orientations of the RF receiving coil, and from the known sequence in which k-space is scanned. This equation, and corresponding equations for general motions of the RF receiving coil, can be directly inverted using known numerical methods for inverting integral equations with known kernels.

For a particular example of uniform translation of the moveable RF coil where k-space is scanned in a uniform and sequential manner, namely reading-out along the x-direction for all phase encode lines along the y-direction before incrementing the phase encode along the z-direction, then $$t=T_y(k_y)+NT_z(k_z),$$

Here, $T_y()$ ($T_z()$) is the time for a scan along the y-direction as a function of the k-values (or similarly along the z-direction), and N is the number of phase encode lines along the y-direction per phase encode lines in the z-direction. If the RF receiving coil is then uniformly translated along the z-direction with a velocity $v_z$, $$W(x,y,z,k_y,k_z)=W(x,y,z-v_z(T_y(k_y)+NT_z(k_z))).$$

$$S_{measured}(t)=\int_x\int_y\int_z m(x,y,z) \cdot W(x,y,z,-v_z \cdot (T_y(k_y)+NT_z(k_z))) \cdot e^{-2\pi i(k_x x+k_y y+k_z z)}dxdydz$$

The resulting signal equation is then given as follows. Since W(x,y,z), the spatial sensitivity of the RF coil is known, the kernel is of a known form, and all information is available to reconstruct the true MR image, m(x,y,z), as discussed above. This simplified equation can then be inverted by known methods.

Alternatively, this equation can be iteratively inverted, or a modeling-based procedure may be applied. See, e.g., Smith et al., 1990, A comparison of models used as alternative magnetic resonance image reconstruction methods Magn. Reson. Imaging 8(2):173–183. For example, starting with a known approximate solution, or approximate reconstructed image, a precise solution can be obtained by optimizing a cost function depending on the difference between the MR signals generated from a current approximate solution according to the appropriate signal equation and the MR signals actually received. A first approximate solution can be determined as an initial image reconstructed from signals received from a standard body coil in the MR apparatus. The appropriate signal equation depends, as described above, on the known instantaneous 3D positions and 3D orientations of the RF receiving coil. This cost function can be optimized by simulated annealing, or by another conventional iterative technique.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A method for magnetic resonance (MR) imaging of a region of interest in an object to be examined by means of a moveable RF receiving coil assembly, the method comprising:

exciting nuclear magnetization in the region of interest by applying radio-frequency (RF) pulses and magnetic field gradients according to a selected imaging protocol, sweeping the moveable RF receiving coil assembly near the region of interest, receiving RF imaging signals generated in an RF receiving coil by the excited nuclear magnetization, wherein the moveable RF receiving coil assembly comprises the RF receiving coil and means for repetitively determining a 3D position and a 3D orientation of the RF receiving coil, determining repetitively 3D positions and 3D orientations of the RF receiving coil during the period of receiving of RF imaging signals, wherein each 3D position and orientation is determined simultaneously, and reconstructing an MR image of the region of interest from the received MR imaging signals and from the determined 3D positions and 3D orientations of the RF receiving coil.

2. The method of claim 1 wherein the means for repetitively determining a 3D position and a 3D orientation comprises at least three MR-active microcoils, and wherein the step of determining repetitively further comprises:

exciting nuclear magnetization in the microcoils, receiving MR signals generated in the microcoils from the excited nuclear magnetization, determining the 3D spatial coordinates of the microcoils from the received MR signals, and determining the 3D position and the 3D orientation of the RF receiving coil from the 3D spatial coordinates of the microcoils.

3. The method of claim 2 wherein the means for repetitively determining the 3D position and the 3D orientation comprises more than three MR-active microcoils.

4. The method of claim 1 further comprising displaying the reconstructed MR image.

5. The method of claim 4 wherein the step of reconstructing further comprises reconstructing a plurality of partial MR images from received MR imaging signals that only partially sample the region of interest, and wherein the step of displaying displays the plurality of partial MR images as they are reconstructed.

6. The method of claim 1 wherein the step of reconstructing further comprises reconstructing an MR image from received MR imaging signals that completely sample the region of interest.

7. The method of claim 1 wherein the step of exciting nuclear magnetization according to the selected imaging protocol further comprises oversampling the center of k-space.

8. The method of claim 7 wherein the oversampling of the center of k-space is triggered to occur upon changes determined in the 3D position or in the 3D orientation of the RF receiving coil.

9. The method of claim 1 wherein the step of determining repetitively further comprises determining periodically 3D positions and 3D orientations of the RF receiving coil.

10. The method of claim 1 wherein the step of determining repetitively further comprises determining 3D positions and 3D orientations of the RF receiving coil when changes in the 3D position or in the 3D orientation are expected.

11. The method of claim 1 wherein the object to be examined is a patient, wherein the region of interest is a cavity in the patient, and wherein the step of sweeping the moveable RF coil assembly comprises sweeping the RF receiving coil near to the periphery of the cavity.

12. A moveable radio-frequency (RF) receiving coil assembly for receiving RF signals generated by nuclear magnetization excited by a magnetic resonance (MR) apparatus in a region of interest in an object to be examined comprising:

manipulation means for manipulating the moveable RF receiving coil assembly, an RF receiving coil for receiving RF imaging signals, at least three MR-active microcoils for receiving MR position signals generated simultaneously by said nuclear magnetization from which the 3D spatial coordinates of the microcoils can be determined repetitively during the period of receiving the RF imaging signals, wherein at least three of the microcoils are non-collinearly arranged, and signal lines for connecting the RF receiving coil and the microcoils to RF receivers in the MR apparatus.

13. The assembly of claim 12 wherein the manipulation means is adapted for introducing the moveable RF receiving coil assembly into a cavity of a patient and for manipulating the moveable RF receiving coil assembly in the cavity.

14. The assembly of claim 12 wherein the manipulation means is adapted for manipulating the moveable RF receiving coil assembly in the exterior of a patient.

15. The assembly of claim 12 further comprising more than three MR-active microcoils.

16. The assembly of claim 12 wherein a separate signal line is provided for the RF receiving coil and for each microcoil.

17. The assembly of claim 12 further comprising a receiving coil holder for mounting the RF receiving coil and the microcoils and to which the manipulation means is coupled.

18. The assembly of claim 17 wherein the receiving coil holder is flexible.

19. A computer readable media encoded with program instructions for causing a programmable control means of an MR apparatus to perform the method of claim 1.

20. An magnetic resonance (MR) apparatus for MR imaging of a region of interest in an object to be examined comprising:

a main field magnet for generating a steady magnetic field in the region of interest, a magnetic field gradient system for generating gradients in the steady magnetic field in the region of interest, a radio-frequency (RF) transmitter for transmitting RF pulses to the region of interest, an RF receiving coil assembly comprising:

manipulation means for manipulating the RF receiving coil assembly, an RF receiving coil for receiving MR imaging signals from the region of interest, at least three MR-active microcoils for simultaneously receiving MR position signals from which the 3D spatial coordinates of the microcoils can be determined, wherein at least three of the microcoils are non-collinearly arranged, and signal lines for connecting the RF receiving coil and the microcoils to the MR apparatus, means for detecting the received MR imaging signals and the received MR position signals, control means responsive to the detected MR imaging signals and the detected MR position signals for controlling the RF transmitter, the magnetic field gradient system, and the means for detecting to (i) excite nuclear magnetization in the region of interest by applying RF pulses and magnetic field gradients according to a selected imaging protocol and to detect MR imaging signals received in the RF receiving coil, (ii) determine repetitively 3D positions and 3D orientations of the RF receiving coil from the detected MR position signals which are simultaneously and repetitively generated during the period of receiving the MR imaging signals, wherein during the period of receiving the MR imaging signals the RF receiving coil is swept near the region of interest, and (iii) to reconstruct an MR image of the region of interest from the received MR imaging signals and from the determined 3D positions and 3D orientations of the RF receiving coil.

* * * * *